(12) United States Patent
Coenen et al.

(10) Patent No.: US 11,163,006 B2
(45) Date of Patent: Nov. 2, 2021

(54) HYBRID BATTERY CHARGER/TESTER

(71) Applicant: VITO NV, Mol (BE)

(72) Inventors: Peter Coenen, Mol (BE); Sven De Breucker, Mol (BE); Grietus Mulder, Mol (BE)

(73) Assignee: VITO NV, Mol (BE)

( * ) Notice: Subject to any disclaimer, the term of this patent is extended or adjusted under 35 U.S.C. 154(b) by 234 days.

(21) Appl. No.: 16/463,898

(22) PCT Filed: Dec. 21, 2017

(86) PCT No.: PCT/EP2017/084269
§ 371 (c)(1),
(2) Date: May 24, 2019

(87) PCT Pub. No.: WO2018/122131
PCT Pub. Date: Jul. 5, 2018

(65) Prior Publication Data
US 2019/0383878 A1    Dec. 19, 2019

(30) Foreign Application Priority Data

Dec. 29, 2016 (EP) .................................. 16207322

(51) Int. Cl.
*G01R 31/382* (2019.01)
*G01R 31/389* (2019.01)
(Continued)

(52) U.S. Cl.
CPC ......... *G01R 31/382* (2019.01); *G01R 31/389* (2019.01); *H02J 7/022* (2013.01); *G01R 31/392* (2019.01)

(58) Field of Classification Search
CPC .. G01R 31/382; G01R 31/389; G01R 31/392; H02J 7/0047; H02J 7/022
See application file for complete search history.

(56) References Cited

U.S. PATENT DOCUMENTS

| 6,104,167 A | 8/2000 | Bertness et al. |
| 7,015,674 B2 * | 3/2006 | VonderHaar ............ H02J 7/345 320/103 |

(Continued)

FOREIGN PATENT DOCUMENTS

| EP | 3163314 A1 | 5/2017 |
| KR | 20160094882 A | 8/2016 |

(Continued)

OTHER PUBLICATIONS

International Preliminary Report on Patentability in corresponding PCT/EP2017/084269, dated Jul. 2, 2019.
(Continued)

*Primary Examiner* — Jay Patidar
(74) *Attorney, Agent, or Firm* — Bacon & Thomas, PLLC (57) ABSTRACT

A hybrid battery charger-testing device is described being a modification of a battery charger having a DC output stage, and a boost converter added to the DC output stage of the charger, the boost converter being configured to output pulses and/or a continuous AC wave for testing a battery. The hybrid charger can be used to output a purely AC test wave, e.g. sinusoidal wave for an electrochemical impedance spectroscopy test, to output pulses such as HPPC pulses and/or to perform GITT or incremental charge tests. For example, determination of battery parameters by diagnostic testing can be achieved by combining the existing functionality of a battery charger with test procedures involving currents much lower than used during charging of the battery or of returning battery energy to the electricity grid.

14 Claims, 3 Drawing Sheets

(51) Int. Cl.
*H02J 7/02* (2016.01)
*G01R 31/392* (2019.01)

(56) References Cited

U.S. PATENT DOCUMENTS

| | | | |
|---|---|---|---|
| 7,786,620 B2 * | 8/2010 | Vuk | H02J 7/345 |
| | | | 307/66 |
| 2006/0038572 A1 | 2/2006 | Philbrook | |
| 2009/0001927 A1 | 1/2009 | Stamos et al. | |
| 2010/0117603 A1 | 5/2010 | Makhija et al. | |

FOREIGN PATENT DOCUMENTS

| | | |
|---|---|---|
| WO | 0062049 A1 | 10/2000 |
| WO | 2016198959 A2 | 12/2016 |

OTHER PUBLICATIONS

International Search Report and Written Opinion in corresponding PCT/EP2017/084269, dated May 2, 2018.
European Search Report in corresponding European Application No. 16207322.5-1804, dated Jul. 4, 2017.

* cited by examiner

HYBRID BATTERY CHARGER/TESTER

The present invention relates to a hybrid battery charger/tester, and a method of using or manufacturing such a charger/tester.

BACKGROUND OF THE INVENTION

The state of health (SoH) of a battery cell can be determined using battery test equipment with accurate voltage and current measurements, for example using impedance spectrometry or by GITT. These techniques are useful if the state of charge of the cell under test is known. This is often achieved by charging the cell completely and then discharging it to the required level at which tests may be performed. All this is time and energy consuming as tests may take up to several days to complete and in case of traction batteries, large amounts of energy need to be transferred in or out of the battery.

Another option is to derive the state of health from operational data of the battery in normal use e.g. by a technique of recording battery parameters during operation. In such a method the actual loading during operation is considered to be equivalent to a test "excitation" or stimulus and the measured battery voltage during this operation is considered as being an associated "response" to the loading. However, the "excitations" are not controlled in accordance with a test protocol and the "response" is not always measured by accurate instruments. In some cases the loading and the variation in this loading may even be such that no useful information on the SoH is obtained. Impedance spectrometry is out of the question is such cases.

Monodirectional and bidirectional chargers are known. Monodirectional chargers are common for all sizes of batteries and would not be able to perform a full range of diagnostic tests because currents will need to flow in both directions during the test. Discharging would require a discharge device such as a discharge resistor which will waste energy from the battery when it is discharging, require cooling and would be extra added weight. Bidirectional chargers are designed to be able to charge a battery and to feed electrical energy back from the battery to the electricity grid. So the current rating for charging will be the same as for discharging and for automotive batteries these current rating are much higher than used in diagnostic testing, hence the low diagnostic test currents could not be measured accurately.

SUMMARY OF THE INVENTION

There is a need for battery testing, e.g. of automotive batteries used to drive a traction motor, which is not costly and time consuming to carry out and is preferably more accurate than test values recorded during use of operational data.

In one aspect the present invention provides a hybrid battery charger-testing device comprising:
a battery charger having a DC output stage, and
a monodirectional or bidirectional boost converter added to the DC output stage of the charger, the monodirectional or bidirectional boost converter being configured to output current test sequences for testing a battery. This allows testing of an automotive battery for driving of a traction motor in a simple manner.

The monodirectional or bidirectional boost converter can be adapted to output monodirectional or bidirectional pulses respectively and/or a continuous AC wave for testing a battery. This allows a wide range of tests to be carried out.

The monodirectional or bidirectional boost converter can be a retrofit boost converter and can be retrofitted to existing chargers. This provides a useful increase in capability for existing chargers without having to purchase a completely new device.

The monodirectional or bidirectional boost converter preferably has a dedicated current and/or voltage sensor, the full scale range of the dedicated current and/or voltage sensor is adapted to test currents or voltages to be applied to the battery. The increased sensitivity cannot be achieved by meters used for operational control.

A bypass of the current and/or voltage sensor can be provided to avoid that operational currents and voltages damage the dedicated devices used in the present invention.

The monodirectional or bidirectional boost converter circuit has a controller for controlling the output of monodirectional or bidirectional pulses respectively and/or the continuous AC wave for testing a battery. The controller can be adapted to communicate with power electronics in the battery charger to output a monodirectional charge pulse. This reuses the charger for test purposes in an efficient manner.

The monodirectional or bidirectional boost converter preferably has a capacitor or capacitors configured so that the boost converter can attain a specified voltage and a capacitor or capacitors to attain a specified capacitance. This provides the boost converter with an ability to generate voltages high enough to charge the battery. At the same time currents during discharging can be absorbed in the capacitors thus not losing energy or requiring current sinks like resistive heaters.

The monodirectional or bidirectional boost converter can be adapted to carry out any, some or all of a GITT test, a HPPC test, an impedance spectroscopy test, an incremental charge test, a pulse test. This provides a large range of test possibilities.

The monodirectional or bidirectional boost converter has storage for storing test results of diagnostic tests performed on a battery. Data acquisition can be used to confirm or refine models of the battery.

In another aspect the present invention provides a retrofit monodirectional or bidirectional boost converter circuit for retrofitting to a battery charger, comprising:
connections for coupling the retrofit monodirectional or bidirectional boost converter circuit to a DC output stage of the battery charger, the retrofit monodirectional or bidirectional boost converter circuit being configured to output current test sequences for testing a battery.

A hybrid battery charger-testing device is described being a modification of a battery charger having a DC output stage, and a boost converter added to the DC output stage of the charger, the boost converter being configured to output pulses and/or a continuous AC wave for testing a battery.

The hybrid charger can be used to output a purely AC test wave, e.g. sinusoidal wave for an electrochemical impedance spectroscopy test, to output pulses such as HPPC pulses and/or to perform GITT or incremental charge tests. For example, determination of battery parameters by diagnostic testing can be achieved by combining the existing functionality of a battery charger with test procedures involving currents much lower than used during charging of the battery or of returning battery energy to the electricity grid.

DEFINITIONS

SOC: state of charge
SOH: state of health
EV: electric vehicle
GITT: Galvanostatic Intermittent Titration Technique
HPPC: Hybrid Pulse Power Characterization
EIS: Electrochemical Impedance Spectroscopy "Retrofitting" or "retrofit" refers to the addition of new technology or features to older systems, i.e. systems comprising legacy devices. A legacy device can be identified by its date of installation or from other records. A retrofitted device can be identified by its date of installation or from other records.

Detailed description of the Invention

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Figure 1:
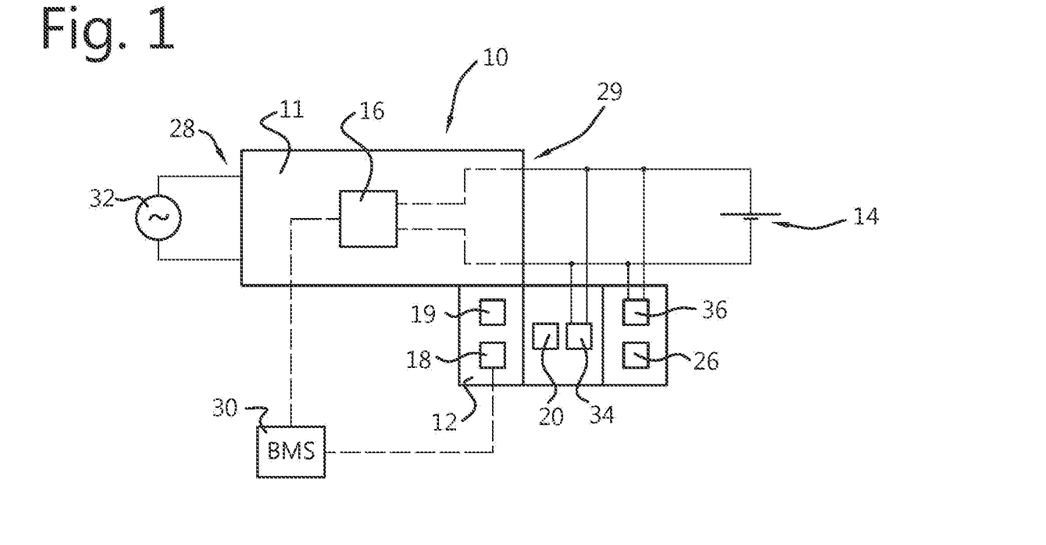
FIG. 1 shows a hybrid charger/tester in accordance with an embodiment of the present invention

With reference to FIG. 1, an aspect of the present invention is a dedicated battery charger 11 adapted to be also a test equipment 12. Such a hybrid charger/tester 10 according to embodiments of the present invention can be on-board or off-board. Whether on-board or off-board, when connected to the battery 14 i.e. at DC level, a hybrid charger/tester 10 according to embodiments of the present invention can have, for example, power electronics 16 to regulate current supplied to the battery, and the voltage of a battery 14. A preferred form of the charger/tester 10 is a charger such as a fast charger for charging automotive batteries for driving traction motors of electric vehicles.

The hybrid battery charger/tester 10 according to embodiments of the present invention is a dedicated battery charger adapted to be also a test equipment. Once the battery 14 is connected to the charger/tester 10, tests can be carried out to determine the State of Charge (SoC) of the battery 14, or to gather test results from which a SoC of the battery or other parameters for the battery can be estimated. The carrying out of tests and the logging of results (data acquisition) can be carried out by a suitable processing engine 18 such as a microcontroller, a microprocessor with dedicated software, FPGA, ASIP, or ASIC combined with suitable memory 19, e.g. Random Access Memory (RAM) and/or non-volatile memory. The test equipment 12 of the hybrid battery/tester 10 according to embodiments of the present invention may be configured to carry out known methods for determining or estimating the SoC. For example, the known methods may be controlled by the processing engine 18 such as the microcontroller, the microprocessor with dedicated software, FPGA, ASIP, or ASIC. The hybrid charger/tester 10 according to embodiments of the present invention may communicate with the battery's management system (BMS 30) from which an initial SoC can be determined, for example. Communication may be carried out between the processing engine 18 and the BMS 30 by means of communication interfaces, e.g. via wired or wireless interfaces whereby the BMS 30 and the hybrid charger/tester 10 may be part of a CAN. The BMS 30 and/or the battery charger/tester 10 may be configured to modify the SoC of the battery by partially charging the battery 14. After this a test cycle may be initiated (e.g. controlled by the BMS 30 and/or the battery charger/tester 10) using the tester 12, e.g. similar or identical to one phase of a proprietary or known diagnostic test for battery health such as an HPPC test. A full HPPC can be performed with bidirectional pulses or only monodirectional pulses can be applied. In many cases such a test is only required at an intermediate SoC level (e.g. not at 0 or 100% but at an intermediate value such as 70%). For example, an advantage of such a test can be to derive from the test results values of the components in an electric equivalent model of the battery, and preferably to obtain these accurately. Current 36 has a full scale range which is adapted to measure currents accurately which are lower than operational charging currents and hence give more accurate values. The voltage sensor 34 can also have a sensitivity that is adapted to the smaller voltage changes during testing. The processing engine 18 such as the microcontroller, the microprocessor with dedicated software, FPGA, ASIP, or ASIC may be configured to derive values for components in the equivalent model of the battery from historical voltage and current measurements. These parameters are preferably stored in a database 20 and test results over a period of time can be recorded in the database 20. This database 20 may be stored as part of the memory 19, or may be stored remotely, e.g. on a server of a local or remote network. A long term evolution can be traced from the stored historical test results. This access to a long term evolution can allow accurate or more accurate State of Health (SoH) estimations. The processing engine 18 such as the microcontroller, the microprocessor with dedicated software, FPGA, ASIP, or ASIC can be configured to determine the long term evolution and the calculation of accurate or more accurate State of Health (SoH) estimations.

For example, the time needed for one HPPC test phase is limited to several minutes so the influence on the charging time is limited. The HPPC test would normally be performed by imposing charge and discharge pulses. As discharging of a battery with a charger 11 is not usually possible or allowed, it is an aspect of the present invention to provide a hybrid charger/tester 10 able to impose currents in either direction or both directions to the battery. The processing engine 18 such as the microcontroller, the microprocessor with dedicated software, FPGA, ASIP, or ASIC may be configured to control the imposition of currents in either direction to the battery, e.g. also pulses in either direction. This is an advantage because a test method using pulses imposed only in the charge direction would initially generate value of unknown relevance until validation of such a method.

In embodiments of the hybrid charger/tester 10 according to the present invention, power electronics of the charger 11 or the tester 12 may be used to inject or extract AC currents into/from a battery 14 as required for impedance spectrometry. Embodiments of the hybrid charger/tester 10 according to the present invention do not require measuring of a complete frequency spectrum and this reduced number of test frequencies has the advantage of reduced test times. Preferably, embodiments of the charger/tester 10 according to the present invention preferably test only at frequencies that are of interest. The processing engine 18 such as the microcontroller, the microprocessor with dedicated software, FPGA, ASIP, or ASIC may be configured to control testing at several frequencies or a single frequency. In particular, embodiments of the hybrid charger/tester 10 according to the present invention test at those frequencies yielding a phase shift close to zero. These test frequencies can be of the order of 1 kHz. This is advantageous because testing at lower frequencies is not used. Testing at <1 kHz requires a much longer test time. In the case the battery charger would not allow discharging, the small AC currents can be superimposed on a small DC current such that the total current never reverses.

Embodiments of the hybrid charger/tester 10 according to the present invention can perform diagnostic test such as differential charge measurement, HPPC or GITT, e.g. under the control of the processing engine 18 such as the microcontroller, the microprocessor with dedicated software, FPGA, ASIP, or ASIC. This yields information on the battery chemistry and age but is time consuming. In accordance with embodiments of the charger/tester 10 according to the present invention these tests are performed if sufficient time is available. This may be indicated by the input of a user action with which the user indicates that a suitable time period is available, e.g. the input indicates that the vehicle will not be used for a certain time period such as the next two days. The hybrid charger/tester 10 of embodiments of the present invention may have user input means 26, e.g. coupled to an I/O port of the processing engine 18 such as the microcontroller, the microprocessor with dedicated software, FPGA, ASIP, or ASIC.

A further alternative is that the processing engine 18 such as the microcontroller, the microprocessor with dedicated software, FPGA, ASIP, or ASIC is adapted to combine the dc-charging process with other diagnostic tests such as the HPPC current pulses or small AC currents tests. The charger current is then a superposition of the required DC-current for charging and AC-current for the impedance spectroscopy. The loss of charging time is limited.

A hybrid charger/tester 10 according to embodiments of this invention differs from a conventional unidirectional charger, a conventional bidirectional charger or a conventional tester with at least one, at least some or all of the following features:

1. It can regulate current and voltage according to different algorithms for testing, charging or discharging than simple (fast) charging. For example the processing engine 18 such as the microcontroller, the microprocessor with dedicated software, FPGA, ASIP, or ASIC may be configured to carry out these algorithms.
2. It is able to make more accurate measurements. For example the processing engine 18 such as the microcontroller, the microprocessor with dedicated software, FPGA, ASIP, or ASIC may be configured to make more accurate measurements by using signals from a voltage sensor 34 and a current sensor 36 whose full scale range and accuracy is adapted to test voltages and currents.
3. It optionally makes use of a battery model for every relevant battery type. Optionally the processing engine 18 such as the microcontroller, the microprocessor with dedicated software, FPGA, ASIP, or ASIC may be configured to store such battery models in memory 19.
4. It can calibrate an individual battery to a chosen model. For example the processing engine 18 such as the microcontroller, the microprocessor with dedicated software, FPGA, ASIP, or ASIC may be configured to calibrate a battery 14 to a chosen model.
5. It can store battery data in a database 20. This database 20 may be local, e.g. stored in memory 19, or at a remote location, e.g. can be the cloud. Embodiments of the hybrid charger/tester 10 according to the present invention can be provided with a communication port and suitable communication capabilities to communicate with a remote database. For example the processing engine 18 such as the microcontroller, the microprocessor with dedicated software, FPGA, ASIP, or ASIC may be configured to make such communications.
6. Embodiments of the hybrid charger/tester 10 according to the present invention may have sufficient non-volatile memory 19 to store historical measurement results of the tester/charger 10 which can be downloaded from time to time to the database 20.
7. Embodiments of the hybrid charger/tester according to the present invention can determine SoH by methods that are not based only on battery operational data but, for example, can include use of predetermined excitations/responses. For example the processing engine 18 such as the microcontroller, the microprocessor with dedicated software, FPGA, ASIP, or ASIC may be configured to determine SoH by methods that are not based only on battery operational data but, for example, can include measurement results from predetermined excitations/responses.
8. Embodiments of the hybrid charger/tester 10 according to the present invention can determine SoH without requiring separate dedicated test equipment that has to be applied in a separate procedure initiated by technicians or requires a time consuming test. The processing engine 18 such as the microcontroller, the microprocessor with dedicated software, FPGA, ASIP, or ASIC may be configured to use the test equipment 12 to determine SoH.

Embodiments of the present invention make use of a battery charger 11 for vehicles as part of a hybrid charger/tester 10 by addition of a monodirectional or bidirectional current testing device 12. There are two main types of chargers for charging batteries of electric vehicles:

A charger to recharge a vehicle's starter battery which is conventional and can typically be a multi-stage charger such as a 3-stage charger for use with embodiments of the present invention.

A charger to recharge an electric vehicle (EV) battery pack for traction motors for use with embodiments of the present invention. A hybrid charger/tester according to embodiments of the present invention can use a single phase or a three phase AC input.

Electric vehicle battery chargers have been provided by companies such as Zivan, Manzanita Micro, Elcon, Quick Charge, Rossco, Brusa, Delta-Q, Kelly, Lester and Soneil. Such chargers can vary from 1 kW to 7.5 kW maximum charge rate. There are various known charge protocols any of which can be used with embodiments of the present invention, such as charging using charge curves, or constant voltage, constant current, etc.

Embodiments of the present invention can be used in public EV charging stations, for example with a power rating of 6 kW.

Rapid charging for use with embodiments of the present invention results in even faster recharge times and is limited only by available AC power, battery type, and the type of charging system.

On-board. EV chargers for use with embodiments of the present invention change AC power to DC power to recharge the EV pack and can be:

Isolated wherein they make no physical connection between the A/C electrical grid and the batteries being charged. These typically employ some form of inductive charging. Some isolated chargers may be used in parallel. This allows for an increased charge current and reduced charging times. Generally, an EV battery has a maximum current rating that cannot be exceeded Non-isolated: the battery charger has a direct electrical connection to the A/C outlet's wiring. Non-isolated chargers cannot be used in parallel.

An off-board or on-board hybrid charger/tester 10 according to any of the embodiments of the present invention can have an AC input side 28 and a DC output side 29 for charging purposes as shown schematically in FIG. 1. For example, the off-board or on-board hybrid charger/tester 10 can include converters which convert the AC voltage of an input AC source 32 such as from a grid to a boosted DC voltage, optionally above the AC-voltage amplitude. The AC side 28 can include one or more Power Factor Converters (PFC). A following DC-DC converter can produce a high frequency AC voltage which is rectified at the secondary of an insulation transformer to generate a DC charging output. A hybrid charger/tester 10 according to embodiments of the present invention may also include a voltage sensor 34 and/or a current sensor 36.

As a further example, the AC side of a hybrid charger/tester 10 according to embodiments of the present invention can be a rectifier with one or several PFC boost converters. The following DC-DC converter can be an isolated full-bridge DC-DC converter.

The PFC boost converters can comprise interleaved PFCs comprising two CCM boost converters in parallel, which operate 180° out of phase. Since in such an arrangement ripple currents are out of phase, they tend to cancel each other and reduce the input ripple current. Interleaving reduces the output ripple current as a function of the duty cycle. The interleaved boost converter inherently takes advantage of paralleled semiconductors to reduce conduction loss. Furthermore, by having the converters switched out of phase, it doubles the effective switching frequency, therefore reducing the input current ripple, resulting in a reduction of the size of an input EMI filter. The interleaved PFC boost converters each operate at half of the load power rating. The full-bridge zero-voltage switching (ZVS) converters can be provided having output rectifiers.

A similar topology can be found in fast chargers for electric vehicles. For example the output can be a buck converter to control the voltage level at the output. There can be two buck-converters, one for the positive and one for the negative voltage period.

Embodiments of the present invention provide a hybrid charger/tester 10 including any known unidirectional charger such as any of the designs mentioned above, whereby the DC output, rectifier, or DC-DC converter e.g. buck converter at the output of the charger does not allow negative currents, i.e. the charger is unidirectional, the charger 11 only applying currents in one direction. The tester 12 according to embodiments of the present invention can provide pulses of either polarity and/or purely AC currents such as sinusoidal, triangular or square wave outputs.

Figure 2:
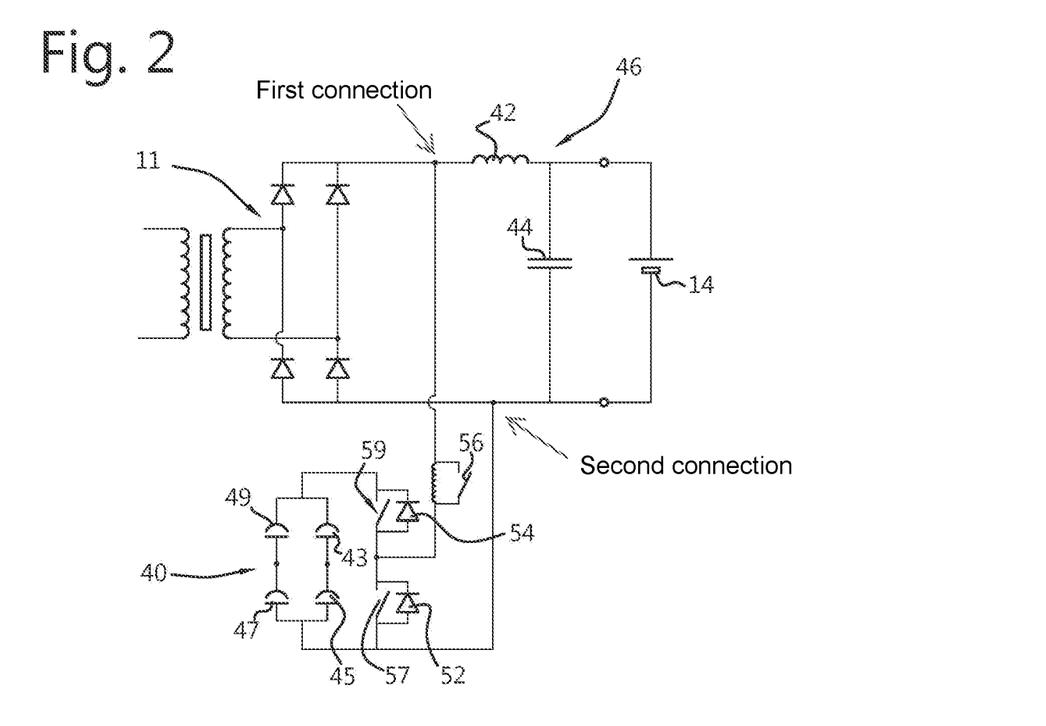
FIG. 2 shows a hybrid charger/tester in accordance with an embodiment of the present invention having a booster circuit.
Figure 3:
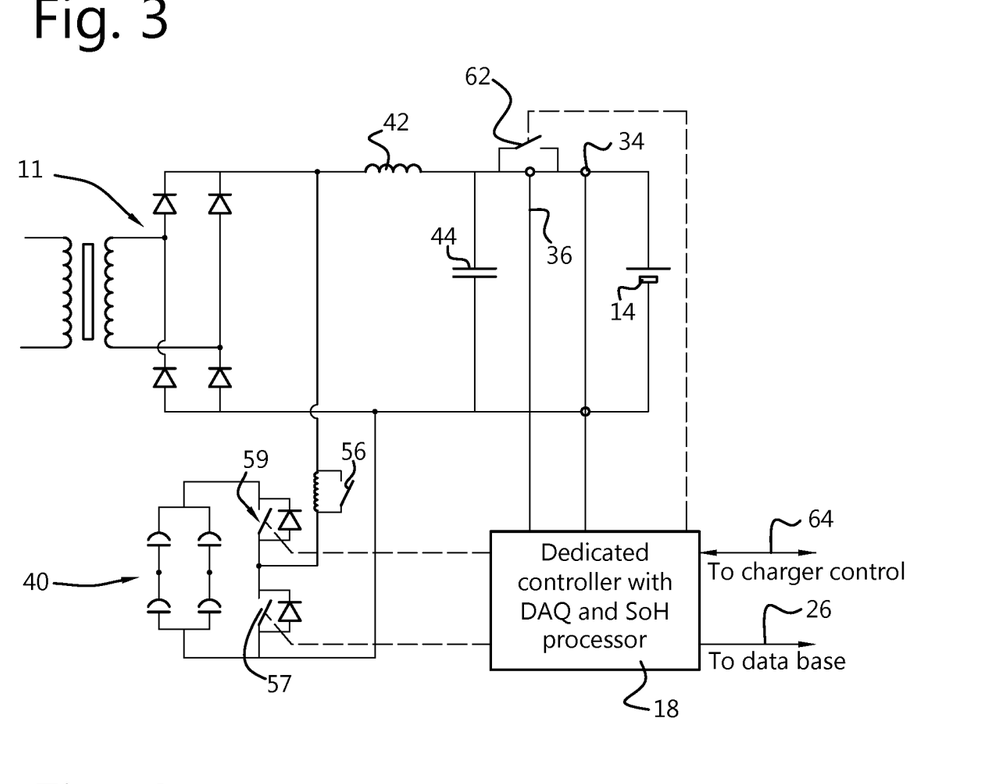
FIG. 3 shows a hybrid charger/tester in accordance with a further embodiment of the present invention having a booster circuit.

For example to enable the tester functions, in embodiments of the present invention a bidirectional boost converter 40 is added to the output of the charger 11, as shown schematically in FIG. 2 and FIG. 3. The boost converter 40 can use the same inductor 42 and capacitor 44 of an LC filter 46 as already available in a typical regular output of a charger 11 or similar on the condition that the charger or fast charger is not delivering any current while the converter 40 is active, otherwise the current is not purely sinusoidal.

The converter 40 only needs to deliver a current of approximately 1 amp AC RMS to produce a measurable voltage ripple in the battery 14. Most automotive batteries have a resistance of above 0.1 Ohm, hence the 1 A current will result in a 0.1 V voltage drop which can be measured accurately by a voltage sensor 34 across the battery but generally cannot be measured by a voltmeter on the charger adapted to measure 300-400 V. The voltage sensor 34 has a full scale rating that is appropriate for the test voltages generated. Also a current sensor 36 is provided which also has a full scale range adapted to measure the lower currents during testing compared to during operation. Most automotive batteries have a maximum voltage at around 300-400 V, so in most cases two diodes 52 and 54 and two semiconductor switches 57 and 59 (with diodes 52, 54 in parallel) such as two 600 V/1 A MOSFETs are sufficient to construct the converter 40. At higher voltages a 1200 V/1 A IGBT can be used. If the existing LC filter 46 is re-used from the charger 11, no additional filter needs to be added, although a small 1 A inductor can be added if the LC-filter 46 is not present. The processing engine 18 such as a microcontroller, microprocessor with dedicated software, FPGA, ASIP, or ASIC may be configured to control the converter 40 to apply such currents by control of the switches 56, 57 and 59.

If a 400 V battery is to be tested with a 1 A current at 1 kHz, the energy comprised within one half cycle is 400 $V_{RMS}*1$ $A_{RMS}*0.5$ ms=200 mJ. If the voltage at the input side of the boost converter is to be restricted to between e.g. 500 and 520 V, than a 20 mF capacitor can be used. This is a feasible solution, and can be attained by putting a capacitor or capacitors 43, 45, 47, 49 such as four 12 mF/450 V capacitors in a configuration with a capacitor or capacitors such as two capacitors in series (to attain the required voltage) and a capacitor or capacitors such as two capacitors in parallel (to attain the required capacitance).

Another embodiment of the boost converter 40 is shown in FIG. 3. All the components and functions of the boost converter 40 shown in FIG. 2 are available in the embodiment shown in FIG. 3, such as use of the same inductor 42 and capacitor 44 of an LC filter 46 already available in a typical regular output of a charger 11, voltage sensor 34 across the battery but generally cannot be measured by a voltmeter on the charger adapted to measure 300-400 V. The voltage sensor 34 has a full scale rating that is appropriate for the test voltages generated. Also a current sensor 36 is provided which also has a full scale range adapted to measure the lower currents during testing compared to during operation. In addition a current sensor bypass is provided, e.g. by a switch 62 under control of the processing engine 18 such as a microcontroller, microprocessor with dedicated software, FPGA, ASIP, or ASIC. Also a small 1 A inductor can be added if the LC-filter 46 is not present. The processing engine 18 such as a microcontroller, micropro- cessor with dedicated software, FPGA, ASIP, or ASIC is also configured to control the boost converter 40 currents by control of the switches 57 and 59 (with diodes 52, 54 in parallel) and switch 56. The processing engine 18 such as a microcontroller, microprocessor with dedicated software, FPGA, ASIP, or ASIC is also configured to communicate with the power electronics of the charger via a connection 64. The processing engine 18 such as a microcontroller, microprocessor with dedicated software, FPGA, ASIP, or ASIC is also configured to communicate with a remote database 26. A capacitor or capacitors such as four capaci- tors 43, 45, 47, 49 in a configuration with a capacitor or capacitors such as two capacitors in series to attain the required voltage and a capacitor or capacitors such as two capacitors in parallel to attain the required capacitance can also, be provided.

In the case of a Hybrid Pulse Power Characterization (HPPC test), a 10 second discharge and charge pulse is imposed by the extra boost converter 40 on the battery at different SoCs of the battery 14. The processing engine 18 such as the microcontroller, the microprocessor with dedi- cated software, FPGA, ASIP, or ASIC may be configured to control the converter 40 to apply monodirectional or bidi- rectional, e.g. discharge and/or charge, pulses. For the charge pulse, the regular output of the charger 11 can be used. The available charge power can be deduced from the measured voltage response and current during the charge pulse. The voltage response and current during the charge pulse can be measured by the voltage and current sensors 34 and 36, respectively. For the discharge pulse, this cannot be supplied by the charger 11 as common fast chargers are unidirectional devices which cannot impose a discharge pulse. Bidirectional chargers for automotive batteries for driving traction motors do not have the current control able to apply such pulses. If this 10 second discharge pulse is to be applied, a switched resistor such as switched resistor 56 can be added to the output of the charger 11 which allows to draw the 10 second discharge pulse. As the pulse is only applied during 10 seconds, the switch and resistor can cope with a significant transient temperature rise, allowing mini- misation of the cooling requirement of both. This switched resistor is added to the charger output. The available dis- charge power can also be deduced from the measured voltage response and the current during the discharge pulse.

The HPPC Test is intended to determine dynamic power capability over the device's useable voltage range using a test profile that incorporates both discharge and regenerating pulses. The processing engine 18 such as the microcon- troller, the microprocessor with dedicated software, FPGA, ASIP, or ASIC may be configured to control the converter 40 by controlling switches 56; 57, 59 to perform the HPPC test and to measure voltage and current variations using voltage sensor 34 and current sensor 36. The first step of this test is to establish, as a function of capacity removed or useable energy, (a) the Vmin0 discharge power capability at the end of a 10-s discharge current pulse and (b) the Vmaxop regeneration power capability at the end of a 10-s regen current pulse. These power and energy capabilities are then used to derive other performance characteristics such as Charge Sustaining Available Energy and Available Power as well as the Charge-Depleting Available Energy for direct comparison with target values for these parameters. The processing engine 18 such as the microcontroller, the micro- processor with dedicated software, FPGA, ASIP, or ASIC may be configured to perform the derivation of these param- eters and the comparisons.

For example, additional data from the HPPC test which can be measured and stored and if required transmitted to a remote device by processing engine 18 such as the micro- controller, the microprocessor with dedicated software, FPGA, ASIP, or ASIC, include the voltage response curves, from which the fixed (ohmic) cell resistance and cell polar- ization resistance as a function of capacity removed can be determined assuming sufficient resolution to reliably estab- lish cell voltage response time constants during discharge, rest, and regen operating regimes. This resolution is pro- vided by voltage sensor 34 and current sensor 36. These data can be used to evaluate resistance degradation during sub- sequent life testing and to develop hybrid battery perfor- mance models for vehicle systems analysis.

Electrochemical Impedance Spectroscopy, EIS, is a pow- erful way to gain information about electrochemical systems such as batteries. It is applied to batteries, fuel cells, and super- or ultra-capacitors. EIS can be useful in all stages of the development of new devices, from initial evaluation of half-cell reaction mechanisms and kinetics, to quality con- trol of packaged batteries. Development of batteries for higher power applications such as electric vehicles has led to development of devices having very low impedance. The impedance of modern batteries is often so low that it cannot be easily or accurately measured using conventional systems on commercial chargers. This problem is addressed by embodiments of the present invention by provision of the boost converter 40. In the case of an electrochemical imped- ance spectroscopy test, the added boost converter 40 with small storage capability is sufficient to excite the battery with a 1 A current ranging from below 1 kHz to the bandwidth of the added small converter which can be several tens of kHz of MOSFETS or GaN switches are used. This allows to perform the EIS test at the specified frequency range. Also the inclusion in the boost converter 40 of a voltmeter 34 and an ammeter 36 with full scale ranges that are appropriate (i.e. have the required sensitivity) for the voltages and currents to be measured allows accurate testing using EIS.

A GITT procedure consists of a series of current pulses, each followed by a relaxation time, in which no current passes through the battery. The processing engine 18 such as the microcontroller, the microprocessor with dedicated soft- ware, FPGA, ASIP, or ASIC may be configured to control the converter 40 to carry out a GITT test. The current is positive during charge and negative during discharge. Dur- ing a positive current pulse, the battery potential quickly increases to a value proportional to the iR drop, where R is the sum of the uncompensated resistance Run and the charge transfer resistance Rct. Afterwards, the potential slowly increases, due to the galvanostatic charge pulse, in order to maintain a constant concentration gradient. When the cur- rent pulse is interrupted, i.e., during the relaxation time, the composition in the electrode tends to become homogeneous, e.g. by Li-ions diffusion in a lithium battery. Consequently, the potential first suddenly decreases to a value proportional to the iR drop, and then it slowly decreases until the electrode is again in equilibrium (i.e., when dE/dt~0) and the open circuit potential (Voc) of the cell is reached. Then, the galvanostatic pulse is applied again, followed by current interruption. This sequence of charge pulse followed by a relaxation time is repeated until the battery is fully charged. During a negative current pulse, the opposite holds. The cell potential quickly decreases to a value proportional to iR. Then, the potential slowly decreases, due to the galvanostatic discharge pulse. During the relaxation time, the potential suddenly increases by a value proportional to iR, and then it slowly increases, until the electrode is again in equilibrium (i.e., when dE/dt~0) and the Voc of the cell is reached. Then, the following galvanostatic pulse is applied, followed by current interruption. This sequence of discharge pulse followed by a relaxation time is repeated until the battery is fully discharged. The chemical diffusion coefficient can be calculated at each step.

In the case of an incremental charge test, the battery is charged at a very slow rate, limited to C/20, thus the charging of a depleted battery will take at least 20 hours. The battery is charged at a constant current during this test. During the charging the voltage will experience one or several voltage plateaus. The processing engine 18 such as the microcontroller, the microprocessor with dedicated software, FPGA, ASIP, or ASIC may be configured to control the converter 40 to carry out an incremental charge test. Based on these results the derivative of the voltage versus the charge (dV/dq) can be plotted in function of the voltage (or SoC). This graph can be used to determine e.g. the SoH of the battery. The processing engine 18 such as the microcontroller, the microprocessor with dedicated software, FPGA, ASIP, or ASIC may be configured to provide the derivative of the voltage versus the charge (dV/dq) in function of the voltage (or SoC) and to determine e.g. the SoH of the battery.

In the cases described above a small converter 40 with minimal storage or a switched resistor 56 is included in the hybrid charger/tester 10 to perform the required tests in both current directions. These additions convert a unidirectional charger 11or bidirectional charger which cannot apply a test negative current from the battery towards the charger into a charger/tester 10 according to embodiments of the present invention.

Test Procedure

Embodiments of the present invention can function with two types of chargers:
1. Those with unidirectional current capability
2. Those with bidirectional capability by nature and capable of delivering high discharge power Bidirectional test capability can be achieved by addition of a low power boost circuit 40 to the charger 11. This can be done as a retrofit action. The booster circuit 40 can be a retrofit circuit. Test currents are very much lower than the charging or discharging currents of automotive batteries so that an additional low power boost circuit 40 is required with voltage and current sensing means 34, 36 that are accurate for the lower voltages and currents of testing compared to operational currents and voltage changes.

Embodiments of the present invention can work with three types of three types of State of Health SoH or State of Charge (SoC) test procedures:
1. Impedance spectrometry (EIS): this test can be performed ether in pure AC or in DC+AC mode.

Information on the relationship between pure AC impedance and SoH can be obtained either from battery manufacturers or from battery testers. A DC+AC (AC superimposed on a DC offset) impedance test requires validation. Embodiments of the present invention can provide full bidirectional charging and (AC EIS) hence there is no need to use unvalidated tests unless desired.

2. HPPC or similar: this test requires a number of high power pulses in and out of a battery that allow the calibration of an equivalent electric model of the battery. Individual pulses can be used for this (e.g. charge pulses), more pulses provide more information and thus a more accurate model. Embodiments of the present invention can provide charge pulses.

Figure 4:
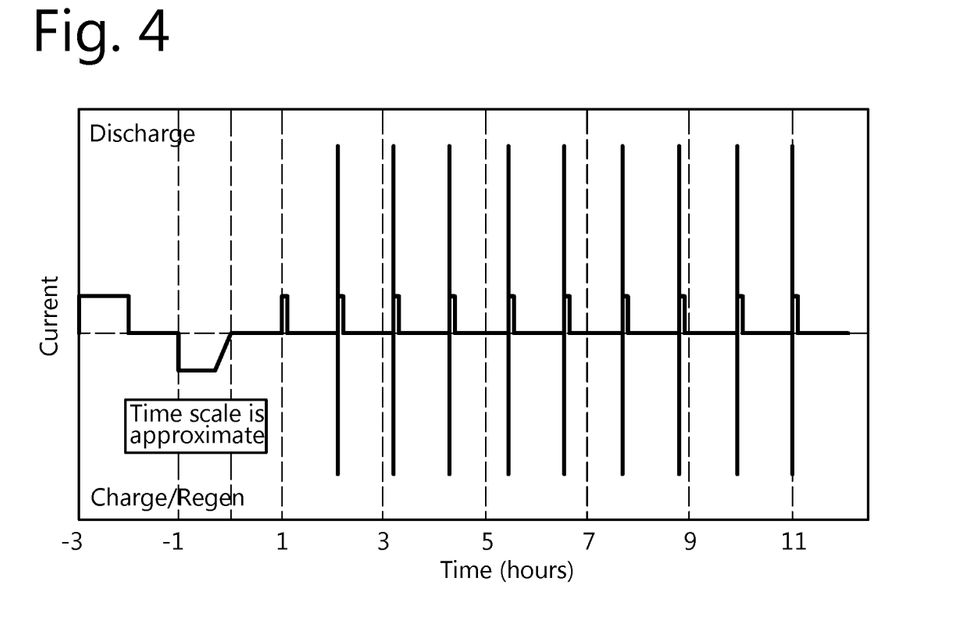
FIG. 4 shows pulses typically applied during an HPPC test.

The HPPC test is as shown in FIG. 4 being a series of pulses in charge and discharge.

Figure 5:
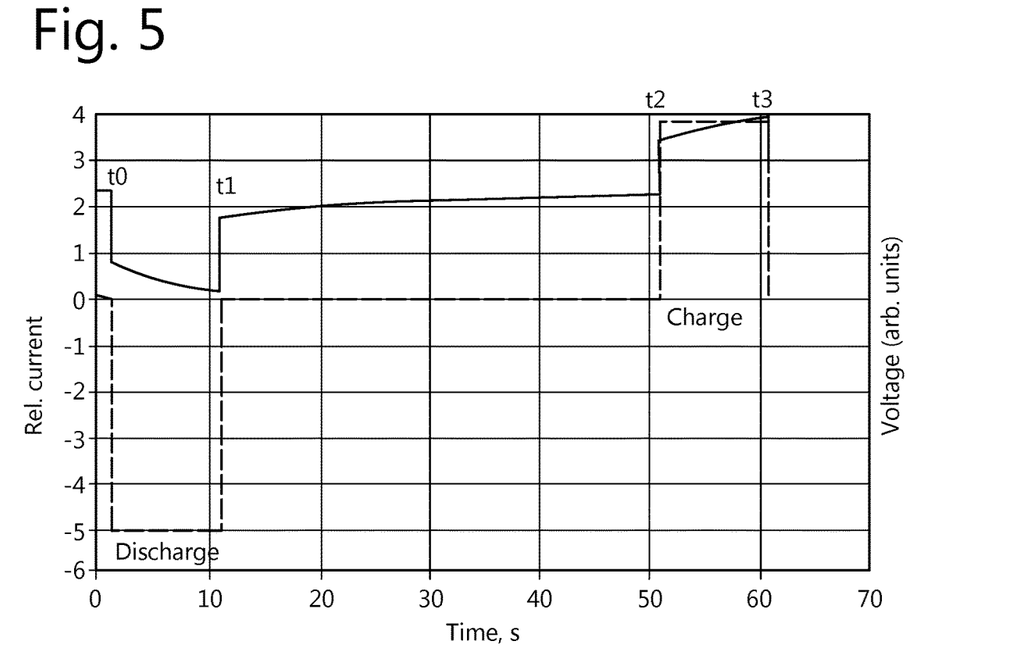
FIG. 5 shows battery responses to pulse tests.
Figure 6:
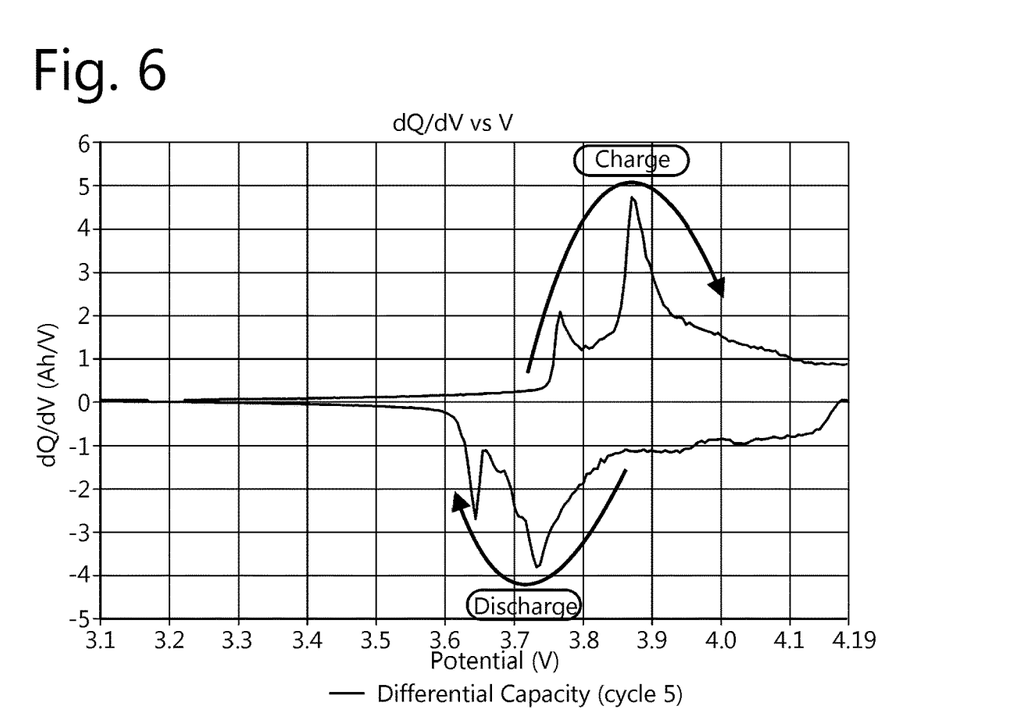
FIG. 6 shows charge and discharge curves of a battery during an incremental charge test.

This procedure allows the calibration of equivalent electric circuits by studying the voltage response to current pulses shown in FIG. 5. As can be seen from FIG. 5 similar information is contained in both current directions thus it is not necessary to provide pulses in both directions. Testing can therefore be performed in only one direction, e.g. during charging 3. Incremental charge: this method evaluates the form of the dq/dV curve while charging and discharging a battery at a low rate. The height and place of the peaks in the curve can be related to the SoH of a battery. The charge and discharge curve resemble each other as can be seen from FIG. 6. The offset between them is determined largely by the double of the voltage drop across the battery's internal resistance caused by the C/20 excitation current. One of the charge/discharge curves plus knowledge of the internal resistance of the battery are sufficient for SoH evaluation. Further, it is not always necessary to start with an empty battery and charge it to completely full at c/20 (in 20 hours) as only the area around the peak(s) are of importance.

SUMMARY

|  | Unidirectional charger | Bidirectional charger with low power discharge | Full power bidirectional charger |
| --- | --- | --- | --- |
| EIS | With or without DC offset | Preferably applied for only a relevant part of the frequency spectrum | Complete frequency spectrum can be covered |
| HPPC | With or without DC offset. Sufficient info can be derived from charge pulses only | Not preferred | Full testing available |
| dq/dV | Full testing available | Available through a bleeder resistor, can be used to confirm internal resistance evolution | Not usually required |

The above mentioned test procedures generally yield relative information. The test results change over time as a battery ages and it is preferred if historical test results are stored from which the aging can be observed. Reference values are preferably obtained when a battery is new and the SoH=100%. The measurements made in this situation should be stored for future reference. Such results can be stored in a central data base so that wherever the battery is charged, any charger can access this data for reference and store the current situation. This allows accurate follow up, preventive actions if needed or even, in future may be, battery fault prediction.

Control and Data Acquisition

Control Options

|  | Unidirectional charger | Bidirectional charger with low power discharge | Full power bidirectional charger |
|---|---|---|---|
| EIS | The controller of the charger power electronics is programmed accordingly | A dedicated controller for the boost converter 40 generates sine wave signals, like an inverter. As the boost converter 40 has its own energy storage, both positive and negative halves are produced. This controller interfaces to the charger controller to disable charging during EIS. | The controller of the charger power electronics needs to be programmed accordingly |
| PT Pulse test | The controller of the charger power electronics needs to be programmed accordingly | Not preferred | The controller of the charger power electronics is programmed accordingly |
| dq/dV IC | The controller of the charger power electronics is programmed accordingly | A dedicated controller for a bleeder resistor generates a constant current draw. This controller interfaces to the charger controller to disable charging during discharging and to enable the constant low IC charging current | Not required |

Data Acquisition Options (e.g. Using Processing Engine 18 and Memory 19)

|  | Unidirectional charger | Bidirectional charger with low power discharge | Full power bidirectional charger |
|---|---|---|---|
| EIS | Dedicated current and voltage sensor 36, 34. The current sensor is preferably bypassed for normal charging | Dedicated current and voltage sensor 36, 34. The current sensor is preferably bypassed for normal charging | Dedicated current and voltage sensor. The current sensor is preferably bypassed for normal charging |
| PT | Use the current and voltage sensors 36, 34. | Not preferred | Use the current and voltage sensors 36, 34. |
| dq/dV IC | A precision current sensor 36 is preferred. It should be bypassed for normal charging | A precision current sensor 36 is preferred. It should be bypassed for normal charging | Not preferred |

The data that is sampled at a high rate and for quite a length of time can result in large amounts of data. The processing engine 18 such as the microcontroller, the microprocessor with dedicated software, FPGA, ASIP, or ASIC may be configured to run SoH algorithms and to store this data (in memory 19 or transmitted to a remote storage) in order to perform calculations on it, e.g. curve fitting.

The processing engine 18 such as the microcontroller, the microprocessor with dedicated software, FPGA, ASIP, or ASIC may be configured to determine the SoH of a battery processor (hardware or software function block). It only needs to know when the excitation is applied. Because both the excitation and the response are measured, no further interfacing with the power electronics controller in the charger 11 is needed.

The invention claimed is:

1. A hybrid battery charger-testing device comprising:
    a battery charger having a DC output stage for charging a battery connected to the DC output stage, and
    a monodirectional or bidirectional boost converter circuit connected to the DC output stage of the charger, configured for testing the battery connected to the DC output stage, the monodirectional or bidirectional boost converter circuit being configured to output current test sequences for testing the battery,
    wherein the monodirectional or bidirectional boost converter circuit has a dedicated current or voltage sensor, a full scale range of the dedicated current or voltage sensor being configured for measuring test currents or voltages to be applied to the battery for testing the battery.

2. The hybrid battery charger-testing device according to claim 1, wherein the monodirectional or bidirectional boost converter is adapted to output monodirectional or bidirectional pulses respectively or a continuous AC wave for testing the battery.

3. The hybrid battery charger-testing device according to claim 2, wherein the monodirectional or bidirectional boost converter circuit has a controller for controlling an output of monodirectional or bidirectional pulses respectively or a continuous AC wave for testing the battery.

4. The hybrid battery charger-testing device according to claim 3, wherein the controller is adapted to communicate with power electronics in the battery charger to output a monodirectional charge pulse.

5. The hybrid battery charger-testing device according to claim 1, further comprising a bypass of the current or voltage sensor.

6. The hybrid battery charger-testing device according to claim 1, wherein the monodirectional or bidirectional boost converter has a capacitor or capacitors configured so that the boost converter attains a specified voltage.

7. The hybrid battery charger-testing device according to claim 1, wherein the monodirectional or bidirectional boost converter is adapted to carry out a GITT test, a HPPC test, an impedance spectroscopy test, an incremental charge test, and a pulse test.

8. The hybrid battery charger-testing device according to claim 1, wherein the monodirectional or bidirectional boost converter has storage for storing test results of diagnostic tests performed on the battery.

9. The hybrid battery charger-testing device according to claim 1, wherein the monodirectional or bidirectional boost converter circuit has a dedicated current and voltage sensor, a full scale range of the dedicated current and voltage sensor being configured for measuring test currents and voltages to be applied to the battery for testing the battery.

10. A retrofit monodirectional or bidirectional boost converter circuit for retrofitting to a battery charger, comprising:
    connections for coupling the retrofit monodirectional or bidirectional boost converter circuit to a DC output stage of the battery charger, the retrofit monodirectional or bidirectional boost converter circuit being configured to output current test sequences for testing a battery,
    wherein the retrofit monodirectional or bidirectional boost converter circuit has a dedicated current or voltage sensor, the full scale range of the dedicated current or voltage sensor being adapted to test currents or voltages to be applied to the battery.

11. The retrofit monodirectional or bidirectional boost converter circuit according to claim 10, wherein the retrofit monodirectional or bidirectional boost converter circuit is adapted to output monodirectional or bidirectional pulses respectively and/or a continuous AC wave for testing the battery.

12. The retrofit monodirectional or bidirectional boost converter circuit according to claim 11, further comprising a bypass of the current or voltage sensor.

13. The retrofit monodirectional or bidirectional boost converter circuit according to claim 10, wherein the retrofit monodirectional or bidirectional boost converter circuit has a controller for controlling an output of monodirectional or bidirectional pulses respectively or a continuous AC wave for testing the battery.

14. The retrofit monodirectional or bidirectional boost converter circuit according to claim 10, wherein the retrofit monodirectional or bidirectional boost converter has a capacitor or capacitors configured so that the retrofit monodirectional or bidirectional boost converter circuit attains a specified voltage.

\* \* \* \* \*